(12) United States Patent
Hwang et al.

(10) Patent No.: US 11,990,466 B2
(45) Date of Patent: May 21, 2024

(54) HIGH VOLTAGE ELECTROSTATIC DEVICES

(71) Applicant: GLOBALFOUNDRIES Singapore Pte. Ltd., Singapore (SG)

(72) Inventors: Kyong Jin Hwang, Singapore (SG); Robert J. Gauthier, Jr., Williston, VT (US); Jie Zeng, Woodlands (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 148 days.

(21) Appl. No.: 17/501,270

(22) Filed: Oct. 14, 2021

(65) Prior Publication Data

US 2023/0121127 A1    Apr. 20, 2023

(51) Int. Cl.
*H01L 27/02* (2006.01)
*H01L 29/08* (2006.01)
(Continued)

(52) U.S. Cl.
CPC ...... *H01L 27/0262* (2013.01); *H01L 29/0821* (2013.01); *H01L 29/735* (2013.01); *H02H 9/046* (2013.01)

(58) Field of Classification Search
CPC ..... H01L 29/0821; H01L 29/72; H01L 29/73; H01L 29/7304; H01L 29/7302; H01L 29/735; H01L 29/0649; H01L 29/66393; H01L 29/74; H01L 29/7404; H01L 29/7408; H01L 29/7416; H01L 29/7432; H01L 29/7436; H01L 29/7424; H01L 29/7801; H01L 29/7809; H01L 27/0288; H01L 27/0259; H01L 27/0262; H01L 27/0296; H01L 27/0641; H01L 27/0647; H01L 27/0652; H01L 27/0658; H01L 27/067; H01L 27/0722; H01L 27/0744;
(Continued)

(56) References Cited

U.S. PATENT DOCUMENTS 5,516,709 A    5/1996 Yamazaki
5,998,854 A *  12/1999 Morishita ......... H01L 29/78654
                                                            257/E27.032
(Continued)

FOREIGN PATENT DOCUMENTS

TW    200644212    12/2006
TW    201340286    10/2013
TW    201539745    10/2015

OTHER PUBLICATIONS

Specification and drawings for U.S. Appl. No. 17/475,942, filed Sep. 15, 2021, 28 pages.
(Continued)

*Primary Examiner* — Natalia A Gondarenko
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to improved turn-on voltage of high voltage electrostatic discharge device and methods of manufacture. The structure comprises a high voltage NPN with polysilicon material on an isolation structure located at a base region, the polysilicon material extending to at least one of a collector and emitter of a bipolar junction transistor (BJT), and the polysilicon material completely covering the base region of the BJT.

20 Claims, 6 Drawing Sheets

(51) Int. Cl.
*H01L 29/735* (2006.01)
*H02H 9/04* (2006.01)

(58) Field of Classification Search
CPC ............... H01L 27/075; H01L 27/0755; H01L 27/0783; H01L 27/0788; H01L 27/0823; H01L 27/0921; H01L 27/0248; H01L 27/0292; H01L 27/0255; H01L 27/0266; H01L 27/0274; H01L 27/0635; H01L 27/1203; H01L 29/42304; H01L 29/66386; H01L 29/7412; H01L 29/747; H01L 29/7392; H01L 29/868; H01L 2924/302; H01L 2924/30205; H01L 2924/1301; H01L 29/808; H01L 29/0692; H01L 29/1095; H01L 29/0634; H01L 29/7835; H01L 29/66901; H01L 29/7816; H01L 29/1066; H01L 29/66681; H01L 29/0615; H01L 29/0661; H01L 29/0623; H01L 29/0865; H01L 29/0886; H01L 29/41725; H01L 29/4238; H01L 29/0834; H01L 29/8086; H01L 29/7811; H01L 29/0619; H01L 29/0653; H01L 29/0696; H01L 29/7832; H01L 29/0847; H01L 29/66659; H01L 29/7838; H01L 29/0843; H01L 29/0882; H01L 29/1083; H01L 29/41758; H01L 29/42316; H01L 29/6606; H01L 29/66893; H01L 29/66568; H01L 29/66674; H02H 9/046
USPC ....... 257/162, 355–360, 173, 350, 361, 124, 257/119
See application file for complete search history.

(56) References Cited

U.S. PATENT DOCUMENTS

| | | | |
|---|---|---|---|
| 6,960,792 | B1 | 11/2005 | Nguyen |
| 7,910,951 | B2 | 3/2011 | Vashchenko |
| 8,049,247 | B2 | 11/2011 | Tseng et al. |
| 8,129,788 | B1 | 3/2012 | Walker et al. |
| 8,994,068 | B2 | 3/2015 | Zhan et al. |
| 9,431,389 | B2 | 8/2016 | Hwang et al. |
| 9,825,020 | B2 | 11/2017 | Besse et al. |
| 10,170,907 | B2 | 1/2019 | Lai |
| 10,361,185 | B2 | 7/2019 | Zhan et al. |
| 2004/0129983 | A1* | 7/2004 | Mallikarjunaswamy ................... H01L 29/7393 257/370 |
| 2005/0167753 | A1* | 8/2005 | Mallikarjunaswamy ................... H01L 27/0259 257/360 |
| 2014/0061740 | A1* | 3/2014 | Ho .................... H01L 29/87 257/296 |
| 2015/0028385 | A1* | 1/2015 | Miyoshi ............ H01L 29/66325 257/141 |
| 2015/0325570 | A1* | 11/2015 | Chen .................. H01L 27/0883 257/140 |
| 2016/0155737 | A1* | 6/2016 | Linewih ................ H02H 9/04 438/239 |
| 2017/0194314 | A1 | 7/2017 | Lee et al. |
| 2018/0247925 | A1* | 8/2018 | Salman ............... H01L 27/0255 |
| 2019/0312026 | A1 | 10/2019 | Zhan et al. |
| 2020/0266303 | A1 | 8/2020 | Sai |
| 2022/0223584 | A1 | 7/2022 | Appaswamy |

OTHER PUBLICATIONS

Chen et al., "Optimization on MOS-Triggered SCR Structures for On-Chip ESD Protection", IEEE Transactions on Electron Devices, vol. 56, No. 7, Jul. 2009, 7 pages.

Yong-Seo Koo et al., "The design of high holding voltage SCR for whole-chip ESD protection", IEICE Electronics Express, vol. 5, No. 17, 624-630, published Sep. 10, 2008, 7 pages.

C. Duvvury et al., "Device Integration for ESD Robustness of High Voltage Power MOSFETs", Proceedings of 1994 EEE International Electron Devices Meeting, 1994, pp. 407-410, doi: 10.1109/IEDM.1994.383381, 4 pages.

A. Ferrara et al., "The Boost Transistor: a Field Plate Controlled Ldmost", IEEE 27th International Symposium on Power Semiconductor Devices & IC's (ISPSD), 2015, 4 pages.

Jung et al., "A Design of BJT-based ESD Protection Device combining SCR for High Voltage Power Clamps", Journal of Semiconductor Technology and Science, vol. 14, No. 3, Jun. 2014, 6 pages.

Do et al., "A New Dual-Direction SCR With High Holding Voltage and Low Dynamic Resistance for 5 V Application", Journal of the Electorn Devices Society, IEEE, vol. 7, May 31, 2019, 5 pages.

Liu et al., "Novel Silicon-Controlled Rectifier (SCR) for High-Voltage Electrostatic Discharge (ESD) Applications", IEEE, vol. 29, No. 7, Jul. 2008, 3 pages.

Koo et al., "The design of high holding voltage SCR for Whole-chip ESD protection", IEICE Electronics Express, vol. 5, No. 17, Sep. 10, 2008, 7 pages.

Wang et al., "Novel High Holding Voltage SCR with Embedded Carrier Recombination Structure for Latch-up Immune and Robust ESD Protection", Nanoscale Research Letters, 2019, 7 pages.

Dai et al., "ESD Protection Design with Stacked High-Holding-Voltage, SCR for High Voltage Pins in a battery Monitoring IC", IEEE, vol. 63, No. 5, May 2016, 7 pages.

Koo et al., "Analysis of SCR-Based ESD Protection Circuit on Holding Voltage Characteristics", International Scholarly and Scientific Research & Innovation, vol. 8, No. 7, 2014, 4 pages.

Specification and drawings for U.S. Appl. No. 17/394,723, filed Aug. 5, 2021, 23 pages.

Office Action in related U.S. Appl. No. 17/394,723 dated Aug. 25, 2023, 9 pages.

Office Action in U.S. Appl. No. 17/475,942 dated Aug. 8, 2023, 7 pages.

Taiwanese Office Action in related TW Application No. 111134635 dated Jun. 13, 2023, 7 pages.

Taiwanese Office Action dated Sep. 23, 2023 with Brief Translation from related Taiwanese Patent Application No. 111134635, 14 pages.

Taiwanese Office Action in TW Application No. 1111125135 dated Oct. 19, 2023, 7 pages.

Notice of Allowance in U.S. Appl. No. 17/475,942 dated Nov. 20, 2023, 10 pages.

Notice of Allowance dated Jan. 30, 2024 in related U.S. Appl. No. 17/394,723, 8 pages.

* cited by examiner

(12) United States Patent

HIGH VOLTAGE ELECTROSTATIC DEVICES

FIELD OF THE INVENTION

The present disclosure relates to semiconductor structures and, more particularly, to high voltage electrostatic discharge devices and methods of manufacture.

BACKGROUND

Electrostatic discharge (ESD) devices protect integrated circuits from the sudden flow of electricity caused by, for example, contact, electrical shorts or dielectric breakdown. ESD devices can thus protect integrated circuits from failure.

ESD devices come in a variety of different structures such as resistors, fuses, etc. In any of these different structures, the ESD devices need to be capable of being in an ESD safe window with high current performance and high holding voltage (Vh) for high voltage applications. For example, the holding voltage needs to be higher than the operating voltage or the device will not turn off. In such a situation, the current will discharge and the integrated circuit can become damaged.

Meeting both high current performance and high holding voltage for high voltage ESD demand is very challenging, though. For example, there is typically a tradeoff between high current performance and high holding voltage. That is, conventional devices typically provide either high current performance or high holding voltage. Illustratively, a high voltage PNP can provide a relatively high holding voltage control but not a high current performance; whereas, a low voltage/high voltage silicon controlled rectifier (SCR) can provide relatively high current performance but not a high holding voltage control. In particular, making high voltage ESD devices for protection of high voltage output drivers is challenging since many ESD devices have a turn on which is not fast enough and not at a low enough voltage due to a junction avalanche based triggering structure.

In known circuits, a late turn on of a high voltage ESD device (i.e., a high turn on voltage, which is higher than an avalanche breakdown voltage) can cause damage to core devices, such as the open drain output driver. Therefore, poor ESD results can occur due to the high turn on voltage causing failures to the specific circuits.

SUMMARY

In an aspect of the disclosure, a structure comprising a high voltage NPN with polysilicon material on an isolation structure located at a base region, the polysilicon material extending to at least one of a collector and emitter of a bipolar junction transistor (BJT), and the polysilicon material completely covering the base region of the BJT.

In an aspect of the disclosure, a structure comprises a high voltage silicon controlled rectifier (SCR) and a polysilicon material on an isolation structure located at a base region, the polysilicon material extending to at least one of a collector and emitter of a bipolar junction transistor (BJT), and the polysilicon material completely covering the base region of the BJT, and the SCR is under an anode and is contacting the isolation structure.

In an aspect of the disclosure, a method comprises forming an electrostatic high voltage device with a single polysilicon material on an isolation structure, forming a bipolar junction transistor (BJT) with a base region which is completely covered by the single polysilicon material, and forming a buried layer which isolates the electrostatic high voltage device from a substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high voltage electrostatic discharge (ESD) devices and methods of manufacture. More specifically, the present disclosure provides a high voltage ESD device with a high voltage (HV)-field MOSFET (i.e., a field LDMOS). In exemplary embodiments, the high voltage ESD devices comprise a high voltage NPN/PNP structure and a high voltage silicon controlled rectifier (SCR). Advantageously, the improved ESD devices control fast turn-on time/lower trigger voltage while keeping high dc breakdown voltage for protection of an output driver, as one example.

More specifically, in embodiments, a polysilicon material may be provided at a field located at a base region and extended to a collector region and emitter region. For example, the ESD device may be a high voltage (HV)-NPN and SCR with a single polysilicon on a field located at base region and extended to a collector/emitter doping region. In this configuration, it is possible to make the ESD transistor turn-on early with a field plate transistor effect.

In addition, the ESD devices may include various well doping under the polysilicon material with, in embodiments, the polysilicon material connecting to an RC circuit. In this configuration, the Vt1 of the ESD device can be controlled by a p-well doping level and thickness of a field oxide, in addition to a fast turn-on against only ESD stress while maintaining a high dc breakdown voltage (DCBV) for normal operation. The ESD devices may also comprise complementary metal-oxide-semiconductor (CMOS)/bipolar, digital components and high-voltage transistor (BCD) processes.

The ESD devices of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD devices of the present disclosure have been adopted from integrated circuit (IC) technology. For example, the structures are built on wafers and are realized in films of material patterned by photolithographic processes on the top of a wafer. In particular, the fabrication of the ESD devices uses three basic building blocks: (i) deposition of thin films of material on a substrate, (ii) applying a patterned mask on top of the films by photolithographic imaging, and (iii) etching the films selectively to the mask.

Figure 1A:
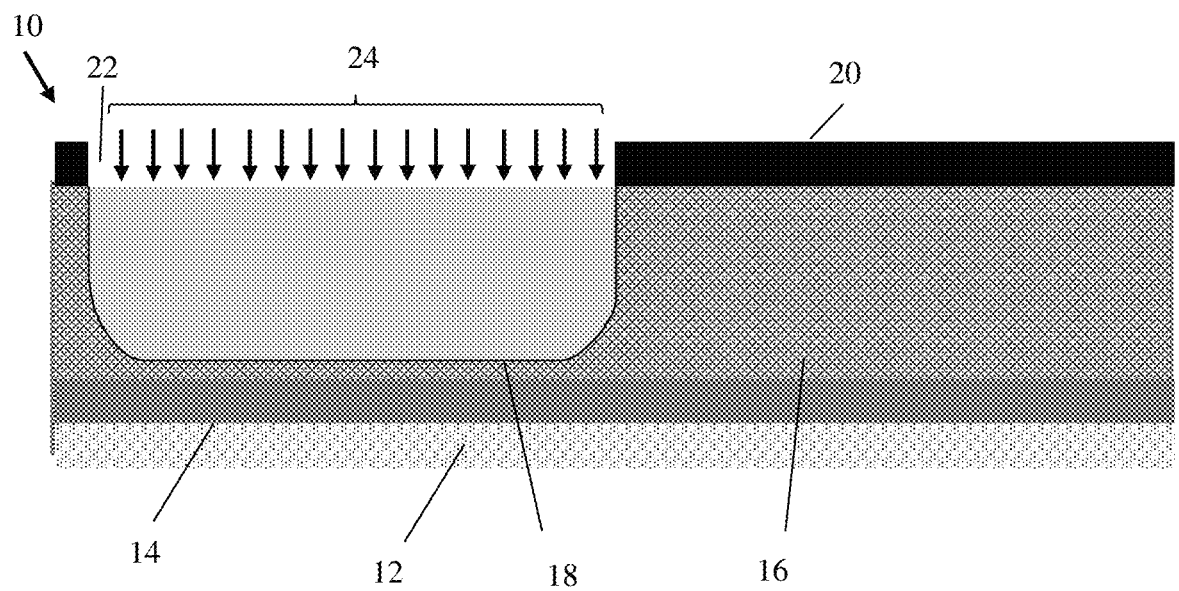
FIGS. 1A-1D show intermediate structures and a final structure comprising a high voltage electrostatic discharge (ESD) device and respective fabrication processes in accordance with aspects of the present disclosure.

FIGS. 1A-1D show intermediate structures and a final structure of a high-voltage ESD device and respective fabrication processes in accordance with aspects of the present disclosure. In particular, FIG. 1A shows a structure 10 comprising a substrate 12. In embodiments, the substrate 12 may be composed of any suitable semiconductor material including, but not limited to, Si, SiGe, SiGeC, SiC, GaAs, InAs, InP, and other III/V or II/VI compound semiconductors.

The substrate 12 includes an n+ region 14. In embodiments, the n+ region 14 may be an n+ buried layer (NBL) formed by introducing a dopant by, for example, using an ion implantation process. In embodiments, the NBL may be a continuous collector NBL. In the ion implantation process, the n+ region 14 may be formed by introducing a concentration of a dopant of n+ dopant type in the substrate 12 using a patterned implantation mask to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The continuous n+ region 14 may be doped with n-type dopants, e.g., Arsenic (As), Phosphorus (P) and Sb, among other suitable examples, at a dopant dose concentration of approximately $1E18$ $cm^{-3}$ to $5E20$ $cm^{-3}$.

Still referring to FIG. 1A, an epitaxial semiconductor material 16 may be grown on the substrate 12, and preferably over the n+ region 14. In embodiments, the epitaxial semiconductor material 16 may be an n-type semiconductor material. In alternative embodiments, the substrate 12 may be thicker so that the upper portion may undergo an ion implantation process with an n-type dopant, e.g., at a concentration of approximately $1E15$ $cm^{-3}$ to $5E17$ $cm^{-3}$. In either scenario, the semiconductor material 16 may be used for a deep N-well structure as described in more detail herein.

A p-well 18 may be formed within the semiconductor material 16, which is in electrical contact with the n+ region 14. In embodiments, the p-well 18 is a high-voltage p-well formed using p-type dopants, e.g., Boron (B). As with any of the well regions described herein, the high-voltage p-well 18 may be formed by deposition of an implantation mask 20 (similar to the mask described above), followed by a patterning process to form an opening 22 and, thereafter, an ion implantation process of certain dopant type, e.g., p-type dopant for the p-wells, shown representatively by arrows 24, e.g., at a concentration of approximately $4E16$ $cm^{-3}$ to $2E18$ $cm^{-3}$. In embodiments, the p-well 18 may be a p-type high-voltage double diffusion drain (HVPDDD), formed using an ion implantation process with an appropriate implantation mask.

Figure 1B:
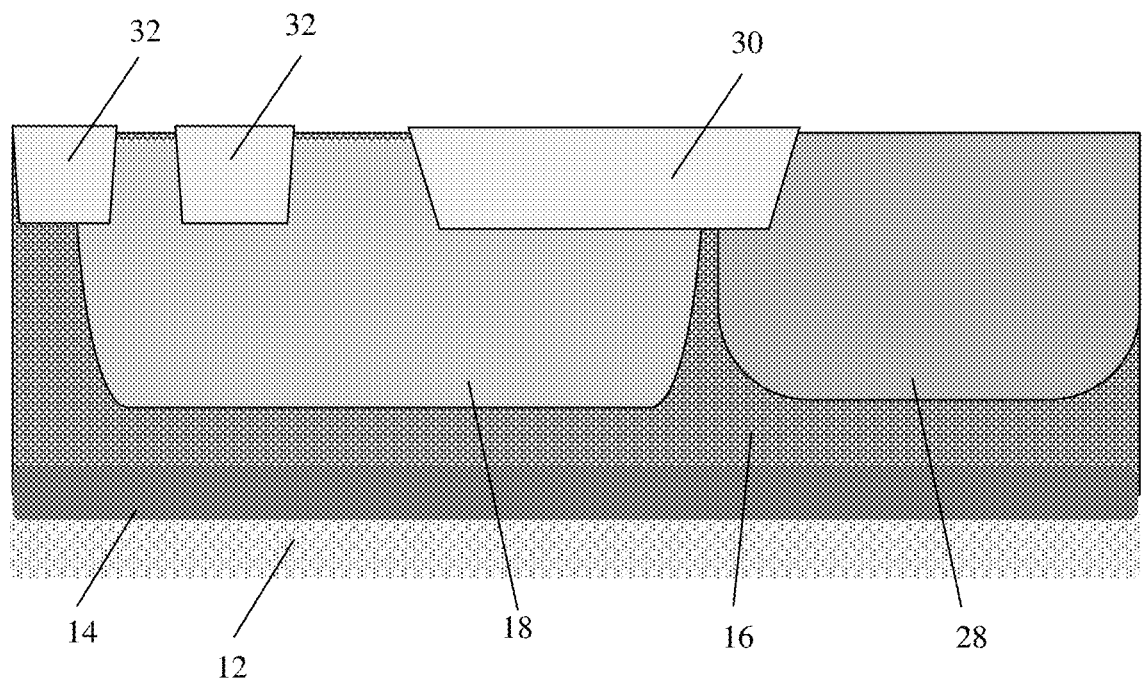

In FIG. 1B, an n-well 28 may be formed in the semiconductor material 16, remote from the p-well 18. In other words, the n-well 28 may be separated from the p-well 18 by the semiconductor material 16. In embodiments, the n-well 28 may be an n-type high-voltage double diffusion drain (HVNDDD) formed by using an ion implantation process with an appropriate implantation mask as already described herein. In embodiments, the n-well 28 may have lower dopant dose concentration to control breakdown voltage, e.g., of approximately $5E15$ $cm^{-3}$ to $4E18$ $cm^{-3}$.

FIG. 1B further shows shallow trench isolation structures 32 in the p-well 18, with shallow trench isolation structures 30 spanning between the wells 34, 36. The shallow trench isolation structures 30, 32 can be formed by conventional lithography, etching and deposition methods known to those of skill in the art. For example, a resist formed over the semiconductor material 16 is exposed to energy (light) to form a pattern (opening). An etching process with a selective chemistry, e.g., reactive ion etching (RIE), will be used to form one or more trenches in the semiconductor material 16 through the openings of the resist. Following the resist removal by a conventional oxygen ashing process or other known stripants, insulator material, e.g., oxide, can be deposited in the trenches by any conventional deposition processes, e.g., chemical vapor deposition (CVD) process, to form the shallow trench isolation structures 30, 32. Any residual insulator material on the surface of the semiconductor material 16 can be removed by conventional chemical mechanical polishing (CMP) processes.

In embodiments, the lateral dimension of the shallow trench isolation region may be adjusted to provide a high DC breakdown voltage and prevention of a lateral SCR. Also, the shallow trench isolation structure 30 may be a local oxidation of silicon (LOCOS) structure. For example, the LOCOS structure 30 may be a process where silicon dioxide is formed in selected areas on a silicon wafer having the Si—$SiO_2$ interface at a lower point than the rest of the silicon surface. In this embodiment, the structure 30 extends between the p-well 18 and n-well 28. A thermal process for the high voltage wells (e.g., dopant activation diffusion) may be provided as is known by those of skill in the art such that no further explanation is required for a complete understanding of the present disclosure.

Figure 1C:
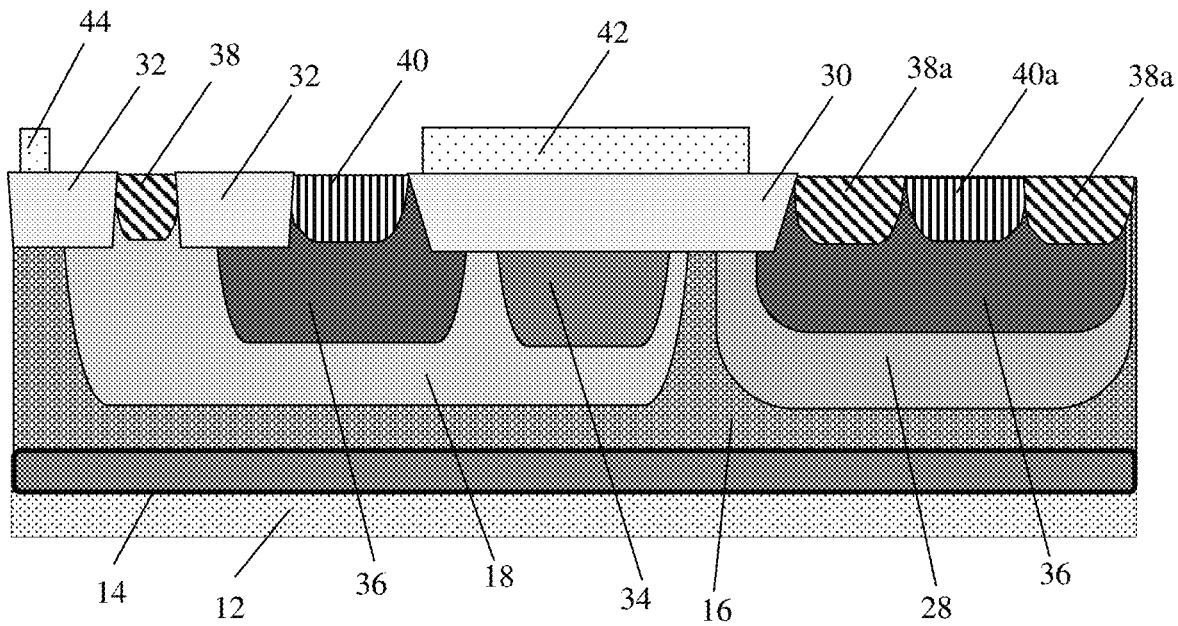

In FIG. 1C, a p-well 34 and an n-well 36 may be formed in the semiconductor material 16. More specifically, the p-well 34 may be formed in the p-well 18 and the n-well 36 may formed in the p-well 18 and the n-well 28. Again, the wells 34, 36 may be formed by conventional ion implantation processes with appropriate dopant types at a dopant dose concentration of, e.g., approximately $1E17$ $cm^{-3}$ to $1E19$ $cm^{-3}$. In addition, a p+ doped region 38 may be formed in the p-well 18 and an n+ doped region 40 may be formed in the n-well 36; whereas, p+ doped regions 38a and n+ doped region 40a may be formed in the n-well 36 using respective p-type dopants and n-type dopants. In embodiments, the n+ doped region 40 may be an emitter region. Also, the combination of the p-well 34 and p-well 18 may be a p-type base region. The p+ doped region 38 and n+ doped region 40 may be doped at a higher dopant concentration, e.g., $5E19$ $cm^{-3}$ to $5E21$ $cm^{-3}$. The structure may undergo a thermal process (e.g., rapid thermal process) for dopant activation and diffusion. The well doping can be used to control the Vt of the device.

FIG. 1C further shows a polysilicon material 42 formed on the LOCOS or shallow trench isolation structure 30. A polysilicon material 44, e.g., resistor, may be formed on the shallow trench isolation structures 32. In embodiments, the polysilicon material 44 may be formed with an appropriate dopant type at a dopant base concentration of, e.g., approximately $1E18$ $cm^{-3}$ to $1E20$ $cm^{-3}$. The polysilicon material 42 and the polysilicon material 44 may be formed by conventional deposition and patterning processes, e.g., lithography and etching methods, known to those of skill in the art as already described herein. For example, the polysilicon material 42 and the polysilicon material 44 are formed by depositing and patterning a polysilicon layer.

Figure 1D:
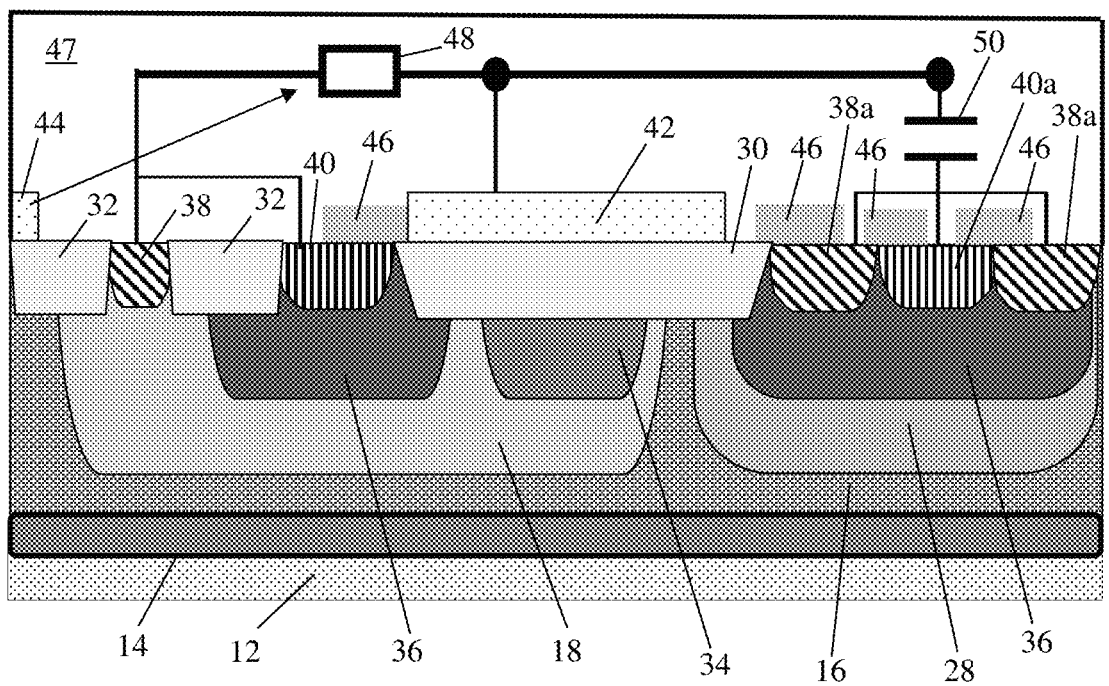

As further shown in FIG. 1D, a silicide block layer (SALPR) 46 may be formed over portions of the structure including, e.g., partially blocking the n+ doped regions 40, 40*a* and partially blocking the p+ doped regions 38*a*. As should be understood by those of skill in the art, the silicide block layer 46 may be formed by conventional deposition and patterning process using a material that is not capable of being silicided. For example, the silicide block layer 46 may be an oxide material or other insulator or blocking material, e.g., nitride.

Following the formation of the silicide block layer 46, a silicide process may be performed on the exposed portions of the semiconductor material 16, e.g., exposed portions of the doped regions 38, 38*a*, 40, 40*a* and polysilicon material 42. The silicide process begins with deposition of a thin transition metal layer, e.g., nickel, cobalt or titanium, over fully formed and patterned devices (e.g., doped or ion implanted regions 38, 38*a*, 40, 40*a*, 42). After deposition of the material, the structure is heated allowing the transition metal to react with exposed silicon (or other semiconductor material as described herein) in the active regions of the device (e.g., doped or ion implanted regions 38*a*, 40, 40*a*) forming a low-resistance transition metal silicide. Following the reaction, any remaining transition metal is removed by chemical etching, leaving silicide contacts in the active regions of the device.

Following the silicide process, an insulator material 47 may be formed over the structure using a conventional deposition process of oxide material, e.g., chemical vapor deposition (CVD) processes. The insulator material 47 undergoes a conventional etching (RIE) process to form openings exposing the silicide of the doped regions 38, 38*a*, 40, 40*a* and polysilicon material 42. Contact metal(s), e.g., aluminum, tungsten, etc., may be deposited within the openings of the insulator material 47 to form contacts in direct contact with the silicide of the region 38, 38*a*, 40, 40*a* and the polysilicon 42.

Further, a resistor 48 may be connected to the doped region 38 through the contacts between the polysilicon material 42 and the p-well 38. In addition, a high voltage alternate polarity metal-oxide-metal (HV APMOM) capacitor 50 may be connected to the doped region 40*a* through the contacts, i.e., between the doped region 40*a* and the polysilicon material 42. In embodiments, the resistor 48 may have a resistance of, e.g., approximately 100 k ohm, which enables fast triggering. Further, the capacitor 50 may have a high voltage, e.g., approximately 40 volts and a capacitance, e.g., approximately 2 pF. In embodiments, the RC circuit can reduce the ESD device turn-on. In embodiments, the resistor 48 and capacitor 50 may be formed using conventional CMOS processes such that no further explanation is required for a complete understanding of the present disclosure.

Figure 2:
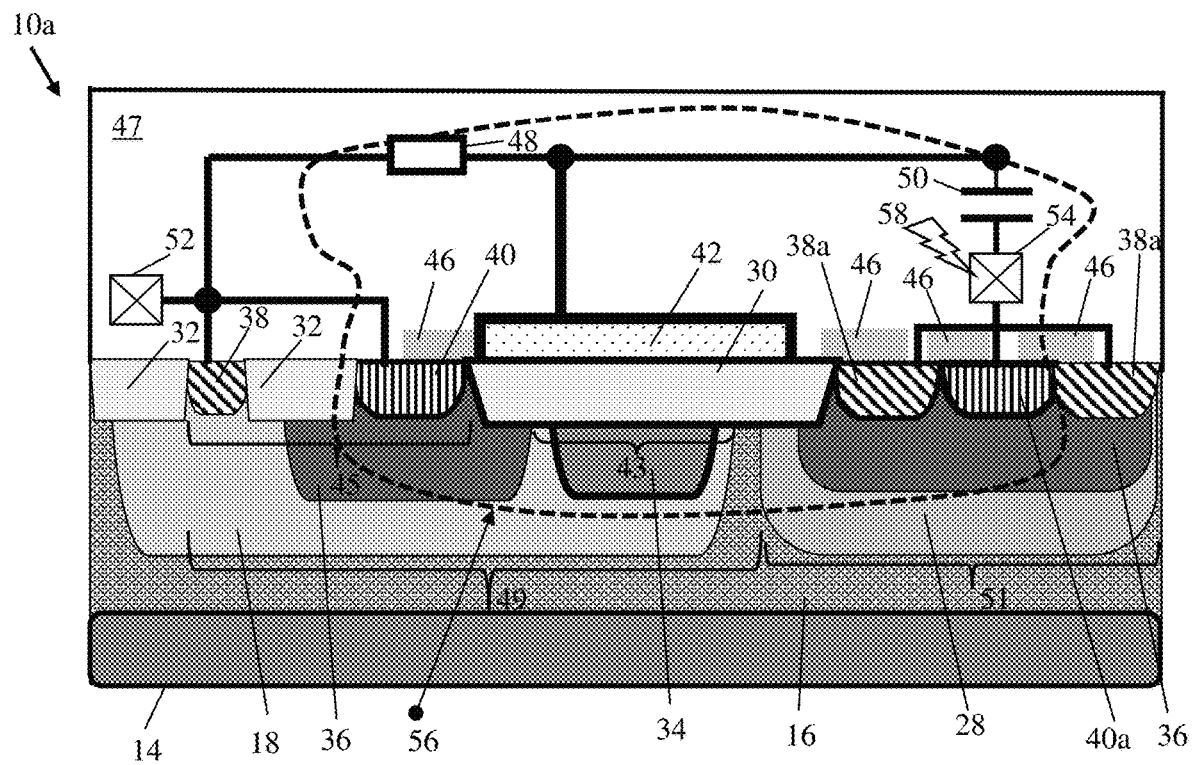
FIG. 2 shows an ESD device in accordance with additional aspects of the present disclosure.

FIG. 2 shows an ESD device in accordance with additional aspects of the present disclosure. In particular, the ESD device 10*a* of FIG. 2 includes the resistor 48 on the contact of a cathode 52. For example, the resistor 48 may be provided on the contact for the p+ doped region 38. Further, the HV APMOM capacitor 50 may be provided on the contact of an anode 54. The anode 54 receives an electric charge 58. For example, the HV APMOM capacitor 50 may be provided on the contact of the n+ doped region 40*a*. In FIG. 2, the dotted line 56 represents an ESD N-Field with the single polysilicon material 42 covering an entire base region and connecting to the RC circuit (i.e., resistor 48 and the HV APMOM capacitor 50).

In FIG. 2, the ESD device 10*a* comprises a high voltage SCR 49, 51 with the polysilicon material 42 (e.g., single layer of polysilicon material) on a field located at a base region 43 and extending to collector/emitter doping region 45. The high voltage SCR includes a PNPN area (i.e., the p+ doped regions 38*a*/n-type area (n-well 36 on right side, n-well 28, and semiconductor material 16)/p-type area (p-well 18 and p-well 34)/n-type area (n-well 36 on left side and n+ doped region 40)). In particular, the layer of polysilicon material 42 on field completely covers the base region 43 of a bipolar junction transistor (BJT) to make the ESD transistor turn on early with a field plate transistor effect. In the ESD device 10*a*, an additional base doping level (e.g., p-well 34) may be under the polysilicon material 42 field (i.e., LOCOS or shallow trench isolation structure 30). Therefore, the ESD device 10*a* threshold voltage (i.e., Vt1) can be controlled by the p-well 34 doping level and thickness of a field oxide.

In the ESD device 10*a*, the single polysilicon material 42 may also be connected to the RC circuit (i.e., resistor 48 and the HV APMOM capacitor 50) to turn on fast against only ESD stress to keep a high dc breakdown voltage for a normal operation. The ESD device 10*a* with the silicide block layer (SALPR) 46 at the collector and emitter regions has a high dc breakdown voltage which can be controlled to be as high as a base area junction design for a high voltage application. For the high voltage application, there is no concern for a gate oxide (i.e., STI at 4000 Å or LOCOS at 3400 Å) breakdown. The RC constant of the RC circuit (i.e., resistor 48 and the HV APMOM capacitor 50) can be adjusted for the ESD device 10*a* reaction against stress signal's rising time in different applications.

Figure 3:
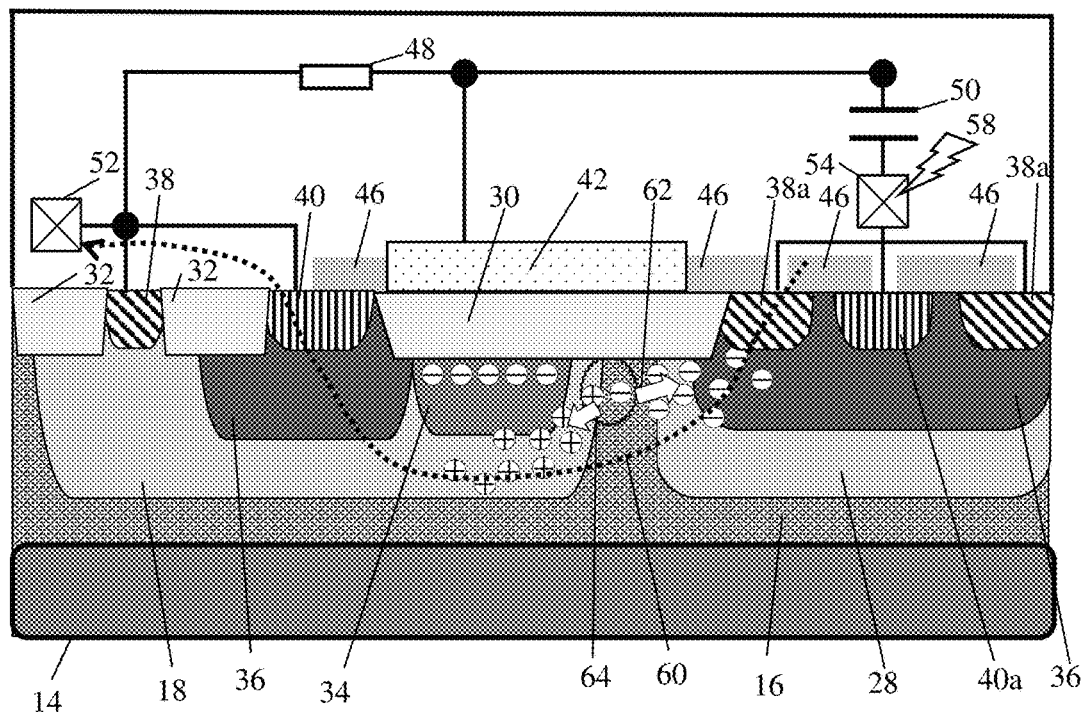
FIG. 3 representatively shows an electrical current flow through the ESD device of FIG. 2.

FIG. 3 representatively shows an electrical current flow through the device of FIG. 2. In particular, the electric current flow is representatively shown by the dashed arrow 60, as it passes from the anode 54 side of the device to the cathode 52 side of the device. In embodiments, the current flow will pass through the p+ doped regions 38*a*, the n-well 36, the n-well 28, the p-well 18, and the n+ doped region 40. It should be recognized by those of ordinary skill in the art that the current flow will be similar in any of the devices described herein, e.g., from the anode 54 side to the cathode 52 side of the ESD device 10*a*. For the explanation of a turn-on stage SCR, the electrons move toward the anode 54 in an inversion current flow as represented by the arrow 62 and holes move toward the cathode 52 in an avalanche/multiplication as represented by the arrow 64. After avalanche and triggering of the SCR, the electric current flow for an ESD discharge is represented by dashed arrow 60.

In FIG. 3, the ESD device 10*a* has a breakdown voltage, e.g., approximately 27 volts. In the present disclosure, the ESD device 10*a* can reduce a trigger voltage for the ESD stress signal in comparison to the high dc breakdown voltage of the ESD device 10*a*. In particular, when the ESD device 10*a* is under ESD stress, a high potential is created. For example, the voltage can rise above 20 volts in a transient time. The field transistor of the ESD device 10*a* can reduce the threshold voltage (i.e., Vt1) when the ESD device 10*a* is under stress. Further, the field transistor threshold voltage (i.e., Vt) can be controlled by the well doping.

Figure 4:
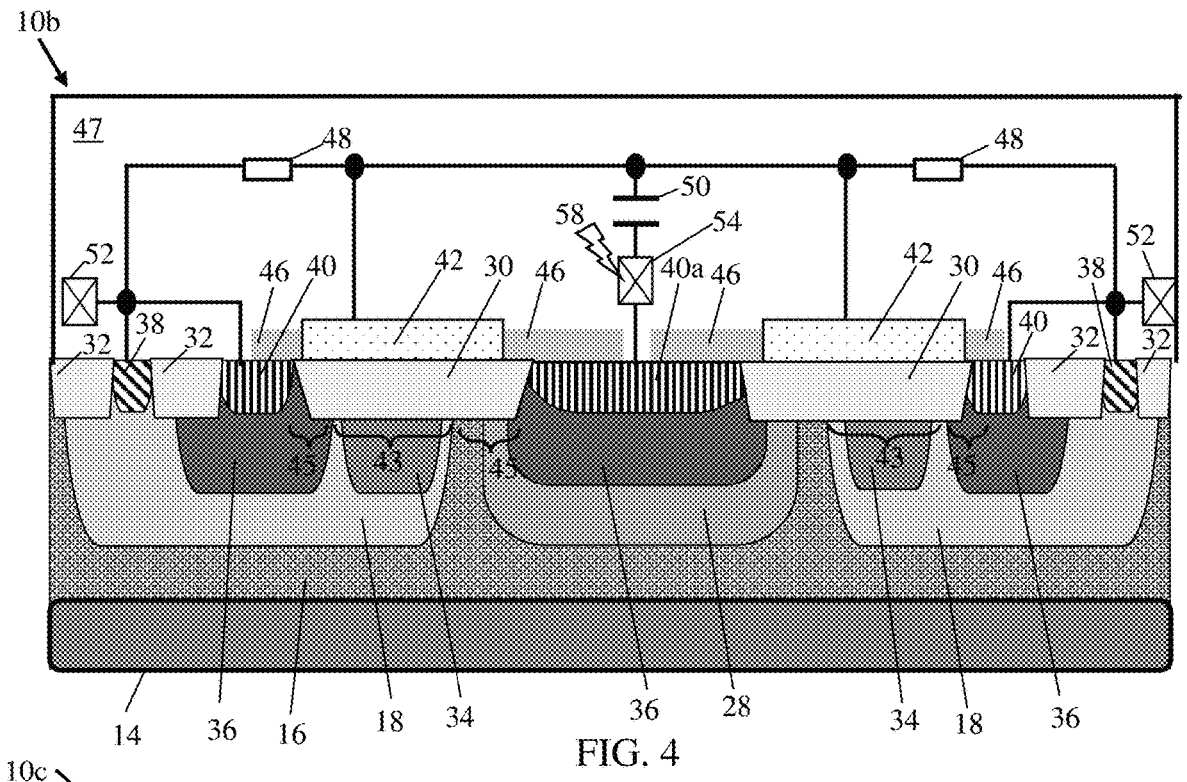
FIGS. 4-7 show differently configured ESD devices in accordance with additional aspects of the present disclosure.

FIG. 4 shows an ESD device 10*b* in accordance with further aspects of the present disclosure. In particular, the ESD device 10*b* of FIG. 4 is an electrostatic device (ESD) high voltage NPN with a polysilicon material 42 on the local oxidation of silicon (LOCOS) or shallow trench isolation structure 30 located at the base region 43 and extending to the collector/emitter doping region 45. For example, the polysilicon material 42 on the LOCOS or shallow trench isolation structure 30 completely covers the base region 43 of the bipolar junction transistor (BJT). The n-type area of the anode 54 and the cathode 52 are partly under the polysilicon material 42 and the LOCOS or shallow trench isolation structure 30 to form the field transistor. Further, for a high voltage application, there is no thin gate oxide under the polysilicon material 42.

Moreover, in the ESD device 10b of FIG. 4, an additional base doping level (e.g., p-well 34) is under the polysilicon material 42 and the LOCOS or shallow trench isolation structure 30 for threshold voltage (e.g., Vt) control. The polysilicon material 42 is connected to the RC circuit (i.e., resistor 48 and the HV APMOM capacitor 50). The ESD device 10b has a whole structure being isolated from the substrate 12 by the n+ region 14. Further, each of the doping regions (e.g., p+ doped regions 38, 38a and n+ doped regions 40, 40a) are different and separated by shallow trench isolation structures 30, 32. The remaining features are the same as with respect to FIG. 1D or 2.

Figure 5:
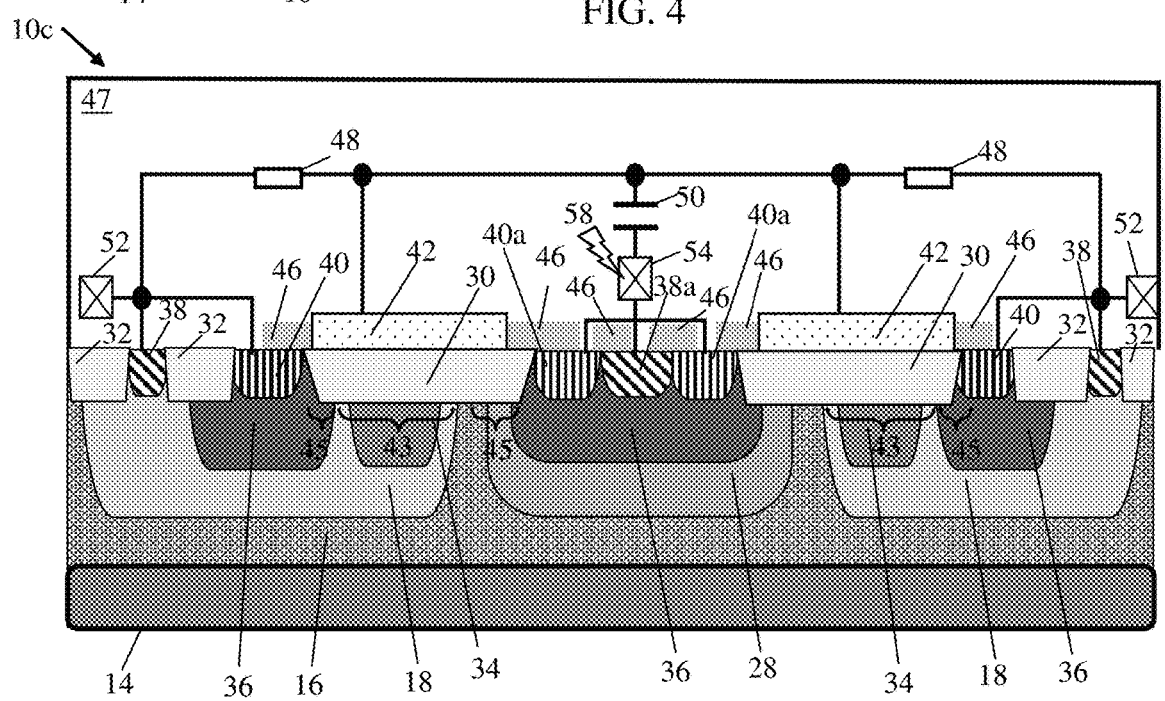

FIG. 5 shows an ESD device 10c in accordance with further aspects of the present disclosure. In particular, the ESD device 10b of FIG. 4 includes an SCR with a polysilicon material 42 on the local oxidation of silicon (LOCOS) or shallow trench isolation structure 30 located at the base region 43 and extended to the collector/emitter doping regions 45; whereas, in FIG. 5, the p+ doped region 38a is sandwiched between n+ doped regions 40a. The remaining features are the same as with respect to FIG. 4 described above.

Figure 6:
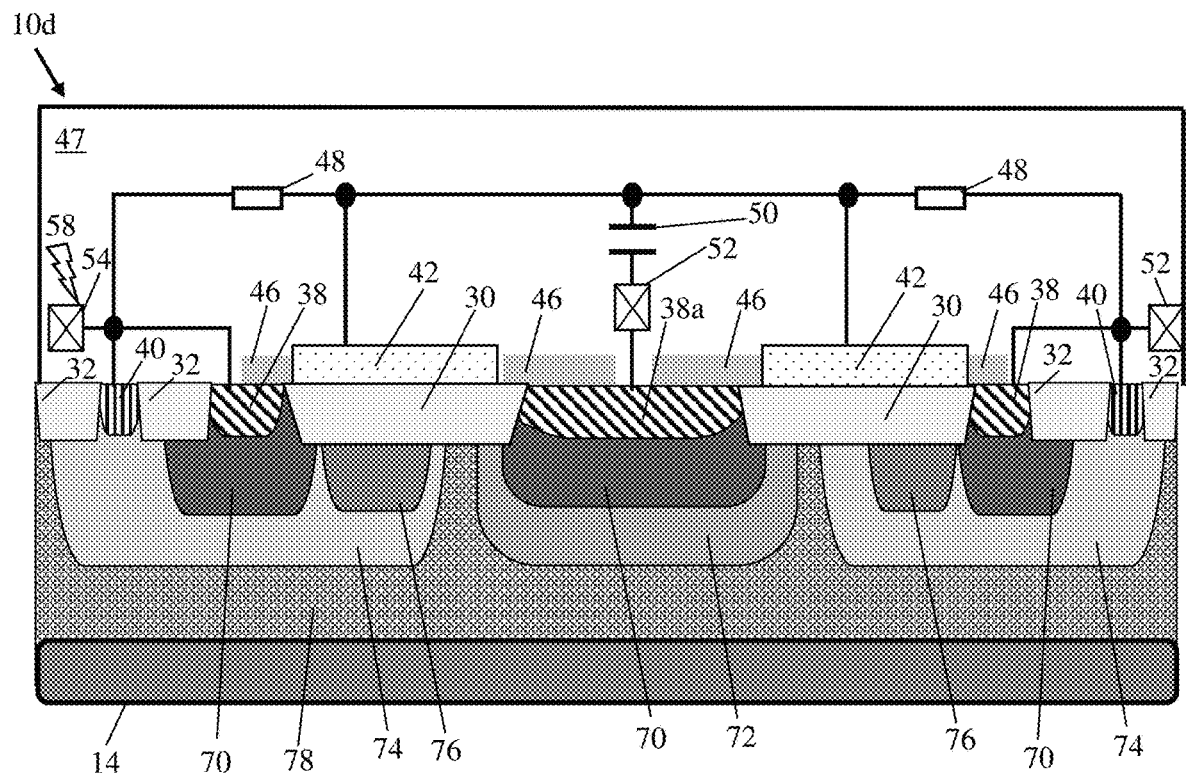

FIG. 6 shows another ESD device in accordance with aspects of the present disclosure. In particular, the ESD device 10d of FIG. 6 is an ESD high voltage PNP with a polysilicon material 42 on the local oxidation of silicon (LOCOS) or shallow trench isolation structure 30 located at a base region and extending to the collector/emitter regions. For example, the polysilicon material 42 on the LOCOS or shallow trench isolation structure 30 completely covers the base region of the bipolar junction transistor (BJT). The p-type area of the anode 54 and the cathode 52 are partly under the polysilicon material 42 and the LOCOS or STI structure 30 to form the field transistor. Further, for a high voltage application, there is no thin gate oxide under the polysilicon material 42. FIG. 6 further shows a p-well 70, a p-type high-voltage double diffusion drain (HVPDDD) 72, a n-type high-voltage double diffusion drain (HVNDDD) 74, a n-well 76, and a p-type epitaxial semiconductor material 78.

In comparison to FIGS. 4 and 5, FIGS. 6 and 7 apply a field N-transistor with the RC circuit and the high voltage electrostatic discharge (ESD) device. In addition, ESD device 10d includes an additional base doping level (e.g., n-well 76) under the polysilicon material 42 and the LOCOS or shallow trench isolation structure 30 to provide threshold voltage (e.g., Vt) control. Also, the polysilicon material 42 is connected to the RC circuit (i.e., resistor 48 and the HV APMOM capacitor 50). In addition, the ESD device 10d has an entire structure being isolated from the substrate 12 by the n+ region 14. The remaining features are the same as with respect to FIG. 1D or 2.

Figure 7:
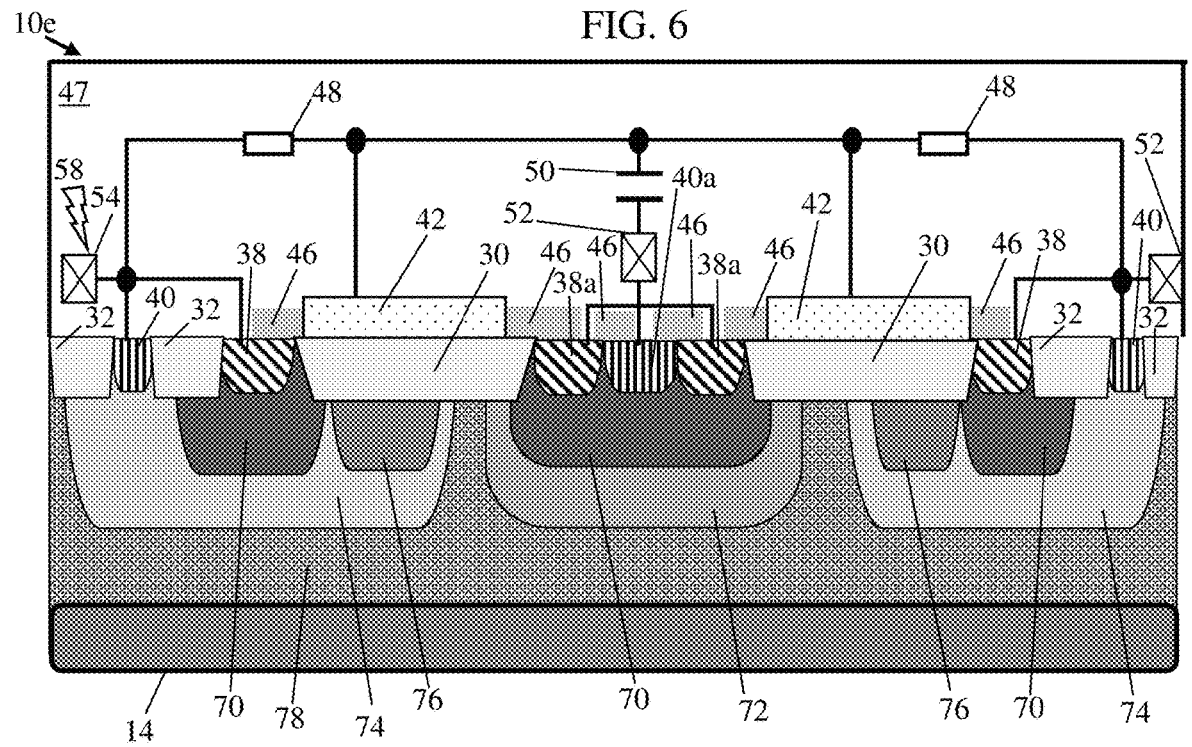

FIG. 7 shows an ESD device in accordance with further aspects of the present disclosure. In particular, the ESD device 10e of FIG. 7 is an ESD SCR with a polysilicon material 42 on the LOCOS or STI structure 30 located at a base region and extended to the collector/emitter regions. In FIG. 7, the n+ doped region 40a is sandwiched between p+ doped regions 38a. FIG. 7 further shows the p-well 70, the p-type high-voltage double diffusion drain (HVPDDD) 72, the n-type high-voltage double diffusion drain (HVNDDD) 74, the n-well 76, and the p-type epitaxial semiconductor material 78 (similar to FIG. 6). The remaining features are the same as with respect to FIG. 6 described above.

Figure 8A:
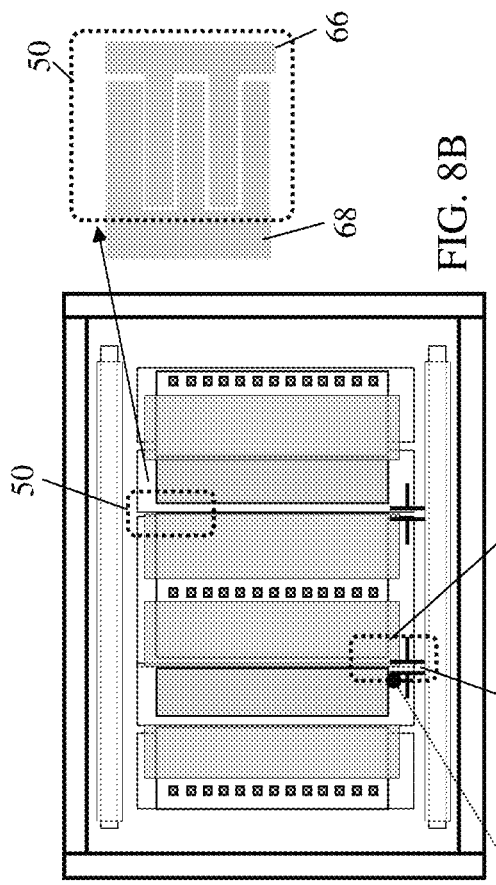
FIGS. 8A-8C show a layout view for the ESD device in accordance with aspects of the present disclosure.
Figure 8B:
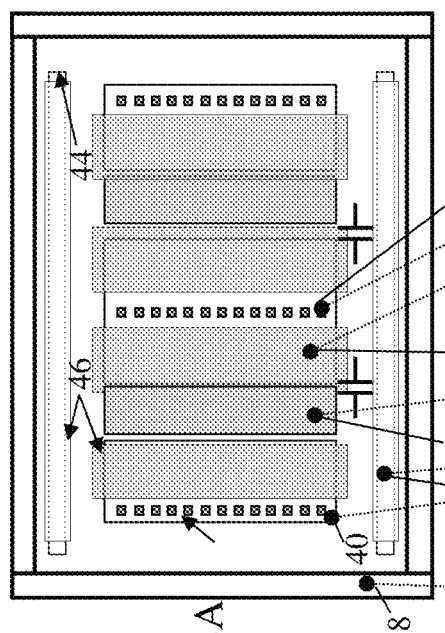
Figure 8C:
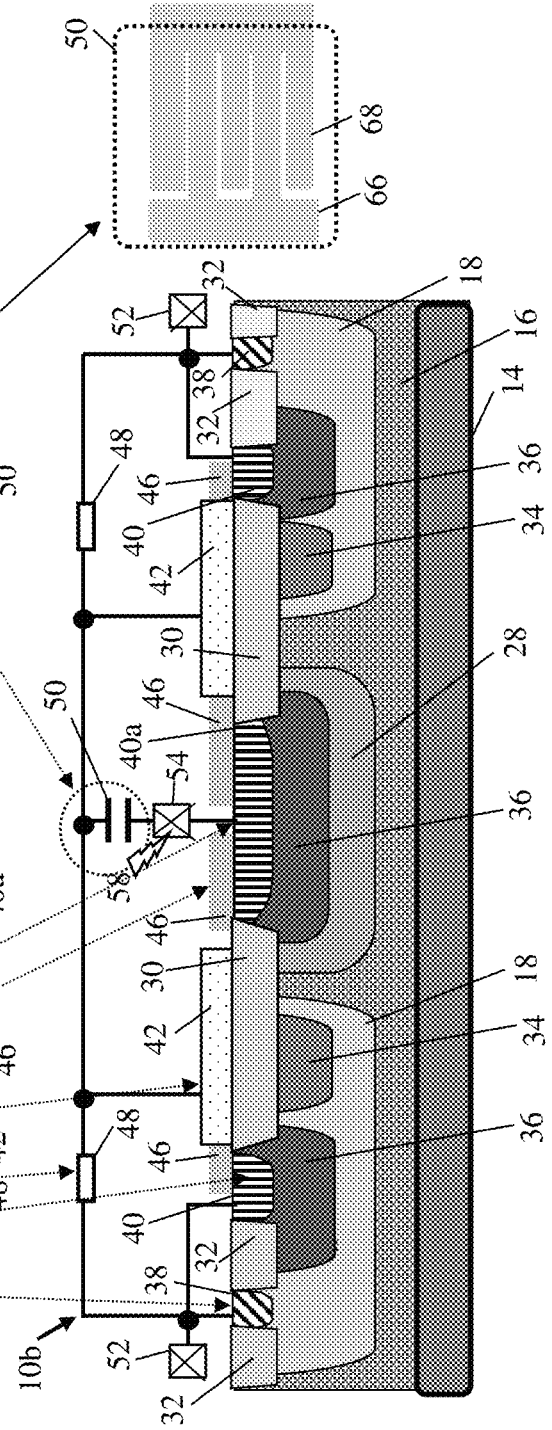

FIGS. 8A-8C show a layout view for the ESD device in accordance with aspects of the present disclosure. In particular, FIGS. 8A-8C show a layout view and a cross-sectional view of an ESD device shown in FIG. 4. In particular, FIG. 8A is a layout view without metal contacts, FIG. 8B is a layout view with metal including the HV APMOM capacitor 50, and FIG. 8C is a cross section view of the ESD device 10b (similar to FIG. 4). Lines are provided between the top view and the cross-sectional view (of the structure shown in FIG. 4) to show the relationship between the structures, e.g., the p+ doped region 38, the n+ doped regions 40, 40a, the polysilicon material 42, the poly resistor 44, the SALPR 46, and the HV APMOM capacitor 50. Further, in FIG. 8B, the HV APMOM capacitor 50 can include a gate metal 66 and a drain metal 68 and can be drawn as a FEOL device region to save area.

The ESD devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising a high voltage NPN with polysilicon material bounded by silicide block layers located at collector and emitter regions, the polysilicon material being on an isolation structure located in a base region, the isolation structure extending between a collector and an emitter within a substrate, the polysilicon material extending to at least one of the collector and the emitter of a bipolar junction transistor (BJT), and the polysilicon material completely covering the base region of the BJT and an epitaxial semiconductor material between the collector and the base region.

2. The structure of claim 1, wherein the isolation structure extends between wells connected to an anode and a cathode.

3. The structure of claim 2, further comprising an n-type area of a field transistor under the isolation structure.

4. The structure of claim 3, further comprising a p-dopant well under the isolation structure.

5. The structure of claim 4, wherein the polysilicon material is exclusively on the isolation structure.

6. The structure of claim 1, further comprising a resistor-capacitor (RC) circuit connecting to the polysilicon material.

7. The structure of claim 6, wherein the RC circuit comprises a resistor connected to a cathode of the high voltage NPN.

8. The structure of claim 6, wherein the RC circuit comprises a high voltage alternate polarity metal-oxide-metal (HV APMOM) capacitor connected to an anode of the high voltage NPN.

9. The structure of claim 6, further comprising a silicon controlled rectifier (SCR) comprising an NPN structure under an anode in an insulator material, the anode connected to the RC circuit.

10. The structure of claim 1, further comprising a substrate isolated from remaining portions of the high voltage NPN by an n+ buried layer.

11. A structure comprising a silicon controlled rectifier (SCR) and a polysilicon material bounded by silicide block layers located at collector and emitter regions, the polysilicon material being on an isolation structure located within a base region, the isolation structure extending between a collector and an emitter within a substrate, the polysilicon material extending to at least one of the collector and the emitter of a bipolar junction transistor (BJT), the polysilicon material completely covering the base region of the BJT, and the SCR is under an anode in an insulator material and the SCR contacting the isolation structure and an epitaxial semiconductor material between the collector and the base region.

12. The structure of claim 11, wherein the isolation structure comprises one of a shallow trench isolation (STI) structure and a local oxidation of silicon (LOCOS) structure.

13. The structure of claim 12, further comprising a p-type area of a field transistor which is under the isolation structure.

14. The structure of claim 13, further comprising an n-dopant well under the isolation structure.

15. The structure of claim 14, further comprising a high voltage NPN under the anode in the insulator material.

16. The structure of claim 11, further comprising a resistor-capacitor (RC) circuit which is connected to the polysilicon material.

17. The structure of claim 16, wherein the RC circuit comprises a resistor connected to a cathode of the SCR.

18. The structure of claim 16, wherein the RC circuit comprises a high voltage alternate polarity metal-oxide-metal (HV APMOM) capacitor connected to the anode.

19. The structure of claim 11, further comprising a substrate isolated from remaining portions of the SCR by an n+ buried layer (NBL).

20. A method, comprising:
   forming an electrostatic high voltage device with a single polysilicon material bounded by silicide block layers located at collector and emitter regions, the single polysilicon material being on an isolation structure, the isolation structure being in a base region and extending between a collector and an emitter within a substrate;
   forming a bipolar junction transistor (BJT) in the base region which is completely covered by the single polysilicon material and an epitaxial semiconductor material between a collector of the BJT and the base region; and
   forming a buried layer which isolates the electrostatic high voltage device from a substrate.

* * * * *